(12) United States Patent
Ban et al.

(10) Patent No.: US 10,727,889 B2
(45) Date of Patent: Jul. 28, 2020

(54) METHOD AND ELECTRONIC DEVICE FOR CONTROLLING TRANSMISSION POWER

(71) Applicant: Samsung Electronics Co., Ltd., Suwon-si, Gyeonggi-do (KR)

(72) Inventors: Seong-Jun Ban, Yongin-si (KR); Hyung-Joon Yu, Uiwang-si (KR); Seung-Bum Ju, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/343,289

(22) PCT Filed: Oct. 20, 2017

(86) PCT No.: PCT/KR2017/011690
§ 371 (c)(1),
(2) Date: Apr. 18, 2019

(87) PCT Pub. No.: WO2018/074898
PCT Pub. Date: Apr. 26, 2018

(65) Prior Publication Data
US 2019/0260409 A1    Aug. 22, 2019

(30) Foreign Application Priority Data

Oct. 21, 2016 (KR) .................. 10-2016-0137719

(51) Int. Cl.
*H04M 1/725* (2006.01)
*H04B 1/3827* (2015.01)
(Continued)

(52) U.S. Cl.
CPC .......... *H04B 1/3838* (2013.01); *G01R 22/10* (2013.01); *G01R 29/08* (2013.01); *H04M 1/725* (2013.01)

(58) Field of Classification Search
CPC ....... H04M 1/725; G01R 22/10; G01R 29/08; H04W 52/24
(Continued)

(56) References Cited

U.S. PATENT DOCUMENTS 5,524,275 A * 6/1996 Lindell ............... H03G 3/3042
455/117
7,146,139 B2 * 12/2006 Nevermann ......... H04B 1/3838
455/115.1
(Continued)

FOREIGN PATENT DOCUMENTS

JP     2013-143575 A   7/2013
KR    10-2011-0005561 A   1/2011
(Continued)

*Primary Examiner* — Hai V Nguyen
(74) *Attorney, Agent, or Firm* — Jefferson IP Law, LLP (57) ABSTRACT

The present invention provides a method and electronic device for controlling transmission power. An electronic device according to various embodiments comprises: a communication module; a memory; and a processor electrically connected to the communication module and the memory, wherein the processor may store a transmission power value during a first time when approaching to or gripping of the electronic device is detected, calculate an average transmission power value of transmission power values stored during the first time, control the communication module to transmit a signal at a first transmission power when an average specific absorption rate value corresponding to the calculated average transmission power value exceeds a threshold specific absorption rate value, and control the communication module to transmit the signal at a second transmission power which is different from the first transmission power when the average specific absorption rate value does not exceed the threshold specific absorption rate value. In addition, other embodiments are possible.

15 Claims, 7 Drawing Sheets

(51) Int. Cl.
*G01R 29/08* (2006.01)
*G01R 22/10* (2006.01)

(58) Field of Classification Search
USPC .......................................................... 455/522
See application file for complete search history.

(56) References Cited

U.S. PATENT DOCUMENTS

| | | | | |
|---|---|---|---|---|
| 7,610,027 B2* | 10/2009 | Alapuranen | ........ | H04W 52/225 455/117 |
| 7,800,368 B2* | 9/2010 | Vaughan | ............ | G01R 33/5612 324/318 |
| 8,711,740 B2* | 4/2014 | Banister | ............ | H04W 56/0015 370/280 |
| 8,744,383 B2* | 6/2014 | Subrahmanya | ...... | H04B 1/3838 455/127.1 |
| 8,897,181 B2* | 11/2014 | Wang | ................ | H04W 72/1215 370/282 |
| 8,897,829 B2* | 11/2014 | Buckley | .............. | H04W 52/223 455/522 |
| 9,088,953 B2* | 7/2015 | Bishop | ................. | H04W 52/36 |
| 9,191,055 B2* | 11/2015 | Lehmann | ............. | H04B 1/3838 |
| 9,253,733 B1* | 2/2016 | Lee | ..................... | H04W 52/283 |
| 9,622,187 B2* | 4/2017 | Logan | .................. | H04W 52/18 |
| 9,705,182 B2* | 7/2017 | Hsu | ........................ | H01Q 1/245 |
| 9,781,687 B2* | 10/2017 | Sen | ........................ | H04W 52/34 |
| 9,997,824 B2* | 6/2018 | Lehmann | ............... | H01Q 1/245 |
| 10,034,297 B2* | 7/2018 | Gandhi | ................. | H04W 12/06 |
| 10,224,974 B2* | 3/2019 | Mercer | ................. | H04W 52/18 |
| 2003/0064761 A1* | 4/2003 | Nevermann | ......... | H04B 1/3838 455/572 |
| 2003/0228875 A1* | 12/2003 | Alapuranen | ........ | H04W 52/225 455/522 |
| 2007/0111681 A1* | 5/2007 | Alberth, Jr. | ........... | H04W 52/34 455/127.1 |
| 2008/0129298 A1* | 6/2008 | Vaughan | ............ | G01R 33/5612 324/322 |
| 2011/0159920 A1* | 6/2011 | Lehmann | ............. | H04B 1/3838 455/556.1 |
| 2012/0142393 A1 | 6/2012 | Won et al. | | |
| 2012/0257657 A1* | 10/2012 | Subrahmanya | ..... | H04W 52/367 375/222 |
| 2013/0122827 A1* | 5/2013 | Ali | ....................... | H04B 1/3838 455/77 |
| 2013/0155884 A1* | 6/2013 | Wang | ................ | H04W 72/1215 370/252 |
| 2013/0176876 A1* | 7/2013 | Wakayama | ......... | H04W 72/048 370/252 |
| 2013/0207806 A1* | 8/2013 | Lehmann | ............. | H04B 1/3838 340/600 |
| 2014/0002305 A1* | 1/2014 | Hsu | ........................ | H01Q 1/245 342/368 |
| 2014/0155119 A1* | 6/2014 | Bishop | ................ | H04W 52/367 455/552.1 |
| 2014/0213192 A1 | 7/2014 | Lagnado | | |
| 2014/0220905 A1* | 8/2014 | Buckley | ............... | H04W 52/223 455/69 |
| 2014/0274190 A1 | 9/2014 | Lu et al. | | |
| 2015/0119100 A1 | 4/2015 | Yu et al. | | |
| 2015/0341869 A1* | 11/2015 | Sen | ....................... | H04W 52/34 455/522 |
| 2017/0064641 A1* | 3/2017 | Logan | ................... | H04W 52/18 |

FOREIGN PATENT DOCUMENTS

| | | |
|---|---|---|
| KR | 10-2014-0107432 A | 9/2014 |
| KR | 10-2014-0128096 A | 11/2014 |

\* cited by examiner

METHOD AND ELECTRONIC DEVICE FOR CONTROLLING TRANSMISSION POWER

CROSS-REFERENCE TO RELATED APPLICATION(S)

This application is a U.S. National Stage application under 35 U.S.C. § 371 of an International application number PCT/KR2017/011690, filed on Oct. 20, 2017, which is based on and claimed priority of a Korean patent application number 10-2016-0137719, filed on Oct. 21, 2016, in the Korean Intellectual Property Office, the disclosure of which is incorporated by reference herein in its entirety.

TECHNICAL FIELD

Various embodiments of the disclosure relate generally to a method and an electronic device for controlling transmission power.

BACKGROUND ART

In recent years, for mobile devices, Specific Absorption Rate (SAR) values have been controlled according to regulations. According to one embodiment, when an electronic device is located in a weak-electric-field network, the electronic device can transmit a signal with transmission power of the maximum transmission power value. In this case, when the proximity of a user (or human body) to the electronic device or a grip on the electronic device by the user (or human body) is detected, the electronic device may back off the transmission power and may transmit a signal with transmission power of a transmission power value that is lower than the maximum transmission power value so that the absorption rate of electromagnetic waves caused by the electronic device does not exceed a regulated SAR value.

DETAILED DESCRIPTION OF THE INVENTION

Technical Problem

However, when an electronic device transmits a signal at backoff transmission power while being in proximity to a user (or human body) or being gripped by the user (or human body), a communication module transmitting the signal may deteriorate in performance.

Various embodiments may provide an electronic device and a method for controlling transmission power depending on whether the electronic device is in proximity to a user (or human body) or is gripped by the user (or human body) in order to prevent the absorption rate of electromagnetic waves caused by the electronic device from exceeding a regulated SAR value and to minimize deterioration in the performance of a communication module.

Technical Solution

An electronic device according to various embodiments may include: a communication module; a memory; and a processor configured to be electrically connected to the communication module and the memory, wherein the processor may be configured to: store a transmission power value during a first time when proximity to the electronic device or a grip on the electronic device is detected; calculate an average transmission power value of transmission power values stored during the first time; control the communication module to transmit a signal at a first transmission power when an average Specific Absorption Rate (SAR) value corresponding to the calculated average transmission power value exceeds an SAR threshold; and control the communication module to transmit the signal at a second transmission power, which is different from the first transmission power, when the average SAR value does not exceed the SAR threshold.

According to various exemplary embodiments, a storage medium may store commands, wherein the commands may be configured to enable at least one processor to perform at least one operation when executed by the at least one processor, and the at least one operation may include: determining whether proximity to an electronic device or a grip on the electronic device is detected; storing a transmission power value during a first time when the proximity to the electronic device or the grip on the electronic device is detected; calculating an average transmission power value of transmission power values stored during the first time; and transmitting a signal at a first transmission power when an average Specific Absorption Rate (SAR) value corresponding to the calculated average transmission power value exceeds an SAR threshold; and transmitting the signal at a second transmission power, which is different from the first transmission power, when the average SAR value does not exceed the SAR threshold.

Advantageous Effects

According to various embodiments of the disclosure, transmission power can be controlled using an average Specific Absorption Rate (SAR) value according to an average power transmission value when the proximity of an object or a grip by the object is detected, thereby satisfying a regulated SAR and reducing deterioration in the transmission performance of a communication module due to transmission power backoff.

According to various embodiments of the disclosure, a signal can be transmitted at transmission power of a maximum transmission power value when the proximity of an object or a grip by the object is not detected, thereby improving the transmission performance of a communication module.

MODE FOR CARRYING OUT THE INVENTION

Hereinafter, various embodiments of the disclosure will be described with reference to the accompanying drawings.

The embodiments and the terms used therein are not intended to limit the technology disclosed herein to specific forms, and should be understood to include various modifications, equivalents, and/or alternatives to the corresponding embodiments. In describing the drawings, similar reference numerals may be used to designate similar constituent elements. A singular expression may include a plural expression unless they are definitely different in a context. In the disclosure, the expression "A or B", "at least one of A and/or B", or "A/B" may include all possible combinations of the items listed. The expression "a first", "a second", "the first", or "the second" may modify various components regardless of the order and/or the importance, and is used merely to distinguish one element from any other element without limiting the corresponding elements. When an element (e.g., first element) is referred to as being "(functionally or communicatively) connected," or "directly coupled" to another element (second element), the element may be connected directly to the another element or connected to the another element through yet another element (e.g., third element).

The expression "configured to" as used in various embodiments of the disclosure may be interchangeably used with, for example, "suitable for", "having the capacity to", "designed to", "adapted to", "made to", or "capable of" in terms of hardware or software, according to circumstances. Alternatively, in some situations, the expression "device configured to" may mean that the device, together with other devices or components, "is able to". For example, the phrase "processor adapted (or configured) to perform A, B, and C" may mean a dedicated processor (e.g., embedded processor) only for performing the corresponding operations or a generic-purpose processor (e.g., Central Processing Unit (CPU) or Application Processor (AP)) that can perform the corresponding operations by executing one or more software programs stored in a memory device.

An electronic device according to various embodiments of the disclosure may include at least one of, for example, a smart phone, a tablet Personal Computer (PC), a mobile phone, a video phone, an electronic book reader (e-book reader), a desktop PC, a laptop PC, a netbook computer, a workstation, a server, a Personal Digital Assistant (PDA), a Portable Multimedia Player (PMP), a MPEG-1 audio layer-3 (MP3) player, a mobile medical device, a camera, and a wearable device. According to various embodiments, the wearable device may include at least one of an accessory type (e.g., a watch, a ring, a bracelet, an anklet, a necklace, a glasses, a contact lens, or a Head-Mounted Device (HMD)), a fabric or clothing integrated type (e.g., an electronic clothing), a body-mounted type (e.g., a skin pad, or tattoo), and a bio-implantable type (e.g., an implantable circuit). In some embodiments, the electronic device may include at least one of, for example, a television, a Digital Video Disk (DVD) player, an audio, a refrigerator, an air conditioner, a vacuum cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame.

In other embodiments, the electronic device may include at least one of various medical devices (e.g., various portable medical measuring devices (a blood glucose monitoring device, a heart rate monitoring device, a blood pressure measuring device, a body temperature measuring device, etc.), a Magnetic Resonance Angiography (MRA), a Magnetic Resonance Imaging (MRI), a Computed Tomography (CT) machine, and an ultrasonic machine), a navigation device, a Global Positioning System (GPS) receiver, an Event Data Recorder (EDR), a Flight Data Recorder (FDR), a Vehicle Infotainment Devices, an electronic devices for a ship (e.g., a navigation device for a ship, and a gyrocompass), avionics, security devices, an automotive head unit, a robot for home or industry, an Automatic Teller's Machine (ATM) in banks, Point Of Sales (POS) in a shop, or internet device of things (e.g., a light bulb, various sensors, electric or gas meter, a sprinkler device, a fire alarm, a thermostat, a streetlamp, a toaster, a sporting goods, a hot water tank, a heater, a boiler, etc.). According to some embodiments, an electronic device may include at least one of a part of furniture or a building/structure, an electronic board, an electronic signature receiving device, a projector, and various types of measuring instruments (e.g., a water meter, an electric meter, a gas meter, a radio wave meter, and the like). In various embodiments, the electronic device may be flexible, or may be a combination of one or more of the aforementioned various devices. The electronic device according to one embodiment of the disclosure is not limited to the above described devices. In the disclosure, the term "user" may indicate a person using an electronic device or a device (e.g., an artificial intelligence electronic device) using an electronic device.

Figure 1:
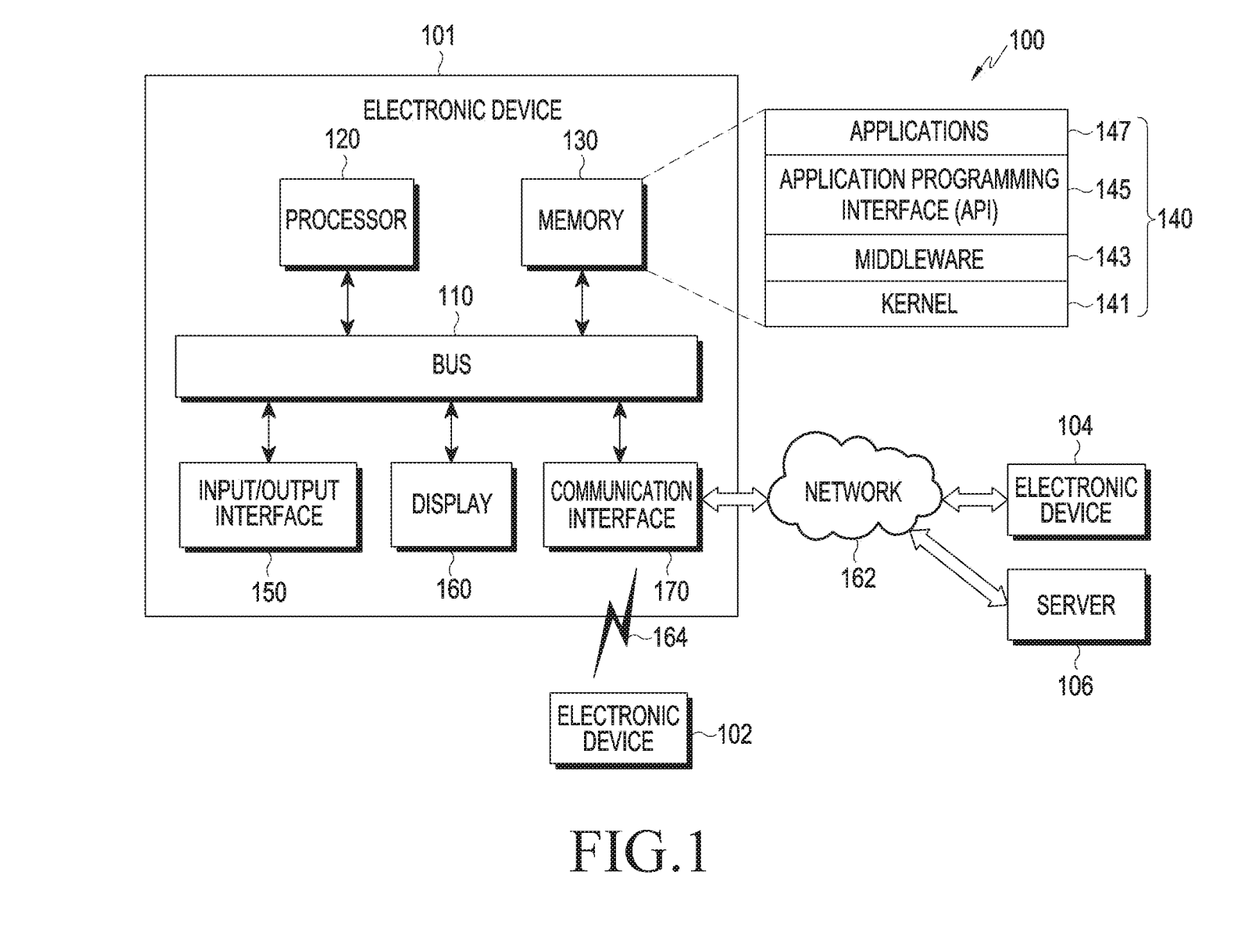
FIG. 1 illustrates a network environment including an electronic device according to various embodiments.

FIG. 1 illustrates an electronic device 101 in a network environment 100 according to various embodiments. The electronic device 101 may include a bus 110, a processor 120, a memory 130, an input/output interface 150, a display 160, and a communication interface 170. In some embodiments, at least one of the components may be omitted, or other components may be further included in the electronic device 101.

The bus 110 may include a circuit that connects the components 110 to 170 to each other and delivers communications (for example, control messages or data) between the components.

The processor 120 may include one or more of a Central Processing Unit (CPU), an Application Processor (AP), and a Communication Processor (CP). The processor 120 may control, for example, at least one different component of the electronic device 101, and/or may perform operations relating to communication or data processing.

According to one embodiment, when an event for controlling transmission power occurs, the processor 120 may store a transmission power value in the memory 130 during a first time, and may calculate the average transmission power value of stored transmission power values. For example, the event for controlling transmission power may include a case where the proximity of an object (for example, a user, a body, a face, a hand, or the like) is detected or a case where the touch of a particular area of the electronic device is detected. According to various embodiments, the event may include a case where a country-mobile carrier code of the electronic device 400 is changed.

The processor 120 may identify an average Specific Absorption Rate (SAR) value corresponding to the calculated average transmission power value and may determine whether the identified average SAR value exceeds an SAR threshold. For example, the memory 130 may store a lookup table including the average transmission power value and the average absorption rate value corresponding to the average transmission power value of transmission power values stored during the first time according to the event for controlling transmission power and the average SRA value corresponding to the average transmission power value. The processor 120 may identify the average SAR value corresponding to the calculated average transmission power value from the lookup table stored in the memory 130.

When the identified average SAR value exceeds the SAR threshold, the processor 120 may control the communication interface 170 to transmit a signal at a first transmission power. When the identified average SAR value does not exceed (or is less than or equal to) the SAR threshold, the processor 120 may control the communication interface 170 to transmit a signal at a second transmission power. For example, the first transmission power may include one of transmission power values that are less than or equal to a transmission power value (for example, a backoff power limit) that is lower than (or backed off from) a maximum output transmission power value for the communication interface 170 to transmit a signal, and the second transmission power may include one of transmission power values that are less than or equal to the maximum output transmission power value (for example, a maximum power limit) for the communication interface 170.

The memory 130 may include volatile and/or nonvolatile memory. The memory 130 may store, for example, a command or data related to at least one different component of the electronic device 101.

According to one embodiment, the memory 130 may store software and/or a program 140. The program 140 may include, for example, a kernel 141, middleware 143, an Application Programming Interface (API) 145, and/or an application (or "app") 147. At least part of the kernel 141, the middleware 143, and the API 145 may be designated as an Operating System (OS).

The kernel 141 may control or manage system resources (for example, the bus 110, the processor 120, the memory 130, or the like) used to perform an operation or function implemented, for example, in other programs (for example, the middleware 143, the API 145, or the application 147). Further, the kernel 141 may provide an interface that allows the middleware 143, the API 145, or the application 147 to access individual components of the electronic device 101 to thereby control or manage system resources.

The middleware 143 may serve as a relay so that, for example, the API 145 or the application 147 communicates with the kernel 141 to exchange data. Further, the middleware 143 may process one or more requests for operations received from the application 147 according to the priority thereof. For example, the middleware 143 may assign at least one application 147 a priority for using a system resource of the electronic device 101 (for example, the bus 110, the processor 120, the memory 130, or the like) and may process the one or more requests for operations. The API 145 is an interface for the application 147 to control a function provided from the kernel 141 or the middleware 143, and may include, for example, at least one interface or function (for example, a command) for file control, window control, image processing, or text control. The input/output interface 150 may deliver a command or data, which is input from, for example, a user or a different external device, to a different component(s) of the electronic device 101, or may output a command or data, which is received from a different component(s) of the electronic device 101, to the user or to the different external device.

The display 160 may include, for example, a Liquid Crystal Display (LCD), a Light-Emitting Diode (LED) display, an Organic Light-Emitting Diode (OLED) display, a Micro-Electro-Mechanical Systems (MEMS) display, or an electronic paper display. The display 160 may display, for example, various types of content (for example, text, an image, a video, an icon, and/or a symbol) for the user. The display 160 may include a touch screen and may receive touch, gesture, proximity, drag, swipe, or hovering input using, for example, an electronic pen or a body part of a user.

The communication interface 170 may establish communication, for example, between the electronic device 101 and an external device (for example, a first external electronic device 102, a second external electronic device 104, or a server 106). For example, the communication interface 170 may be connected to a network 162 via wireless communication or wired communication to communicate with the external device (for example, the second external electronic device 104 or the server 106).

The wireless communication may include cellular communication using, for example, at least one of Long-Term Evolution (LTE), LTE-Advanced (LTE-A), Code Division Multiple Access (CDMA), Wideband CDMA (WCDMA), Universal Mobile Telecommunications System (UMTS), Wireless Broadband (WiBro), and Global System for Mobile Communications (GSM). According to one embodiment, the wireless communication may include, for example, at least one of Wireless Fidelity (Wi-Fi), Bluetooth, Bluetooth Low Energy (BLE), ZigBee, Near-Field Communication (NFC), Magnetic Secure Transmission (MST), Radio Frequency (RF), or a Body Area Network (BAN). According to one embodiment, the wireless communication may include a Global Navigation Satellite System (GNSS). The GNSS may be, for example, a Global Positioning System (GPS), a Global Navigation Satellite System (GNSS), a BeiDou Navigation Satellite System (hereinafter, "BeiDou"), or Galileo, which is the European global satellite-based navigation system. In this document, "GPS" may be interchangeably used with "GNSS". The wired communication may include, for example, at least one of Universal Serial Bus (USB), High-Definition Multimedia Interface (HDMI), Recommended Standard 232 (RS-232), Power Line Communication, and Plain Old Telephone Service (POTS). The network 162 may include a telecommunications network, which may be, for example, at least one of a computer network (for example, a Local Area Network (LAN) or Wide Area Network (WAN)), the Internet, and a telephone network.

Each of the first and second external electronic devices 102 and 104 may be a device of a type that is the same as, or different from, that of the electronic device 101.

According to various embodiments, all or some of the operations performed in the electronic device 101 may be performed in another electronic device or a plurality of electronic devices (for example, the electronic devices 102 and 104 or the server 106).

According to one embodiment, when the electronic device 101 needs to perform a function or service automatically or upon request, the electronic device 101 may request another electronic device (for example, the electronic device 102 or 104, or the server 106) to perform at least some functions related to the function or service, instead of, or in addition to, autonomously performing the function or service. The other electronic device (for example, the electronic device 102 or 104, or the server 106) may perform the requested functions or additional functions and may transmit the result thereof to the electronic device 101. The electronic device 101 may provide the requested function or service using the result as it was received or after additionally processing the result. To this end, for example, cloud-computing, distributed-computing, or client-server-computing technologies may be used.

Figure 2:
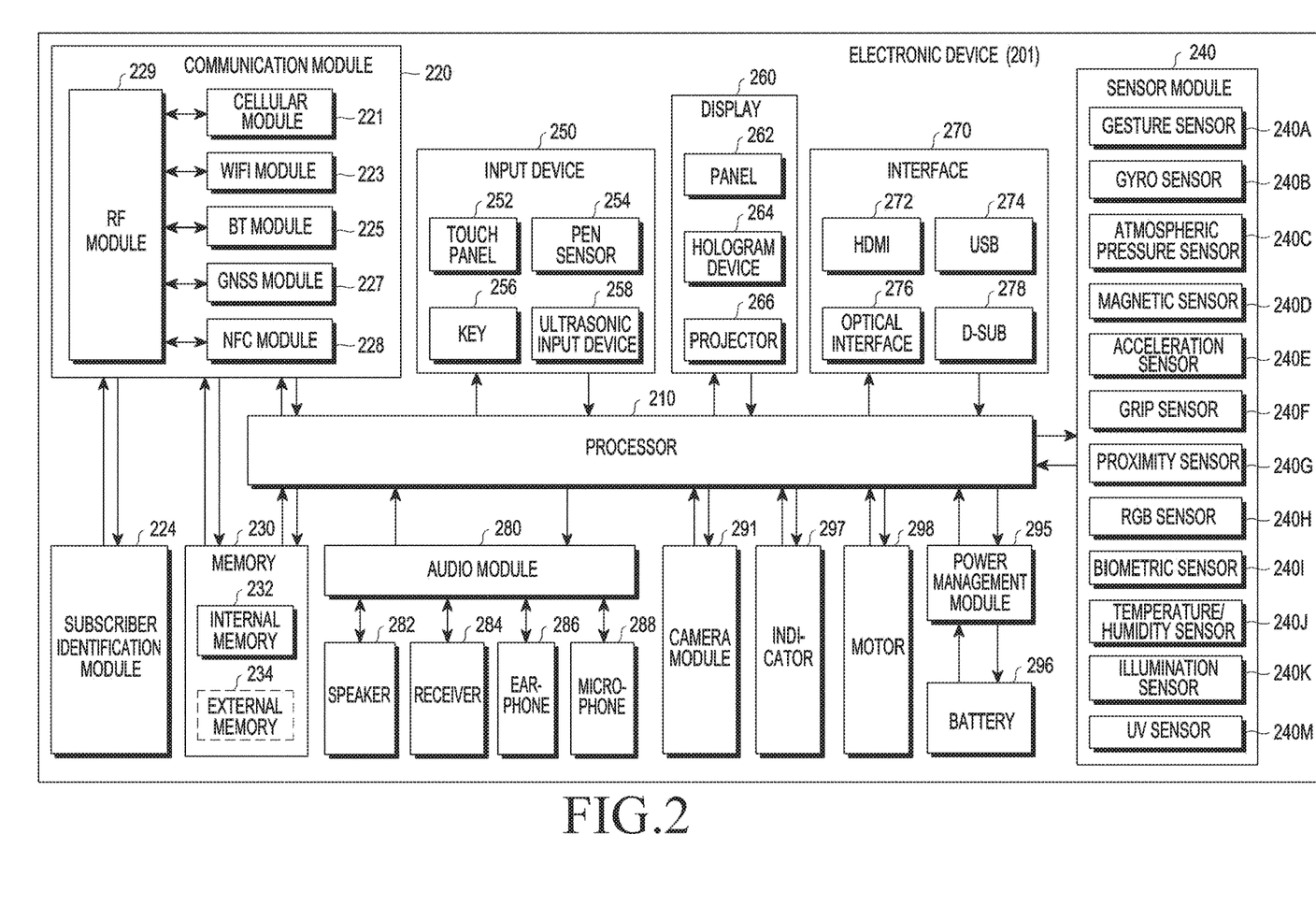
FIG. 2 is a block diagram illustrating an electronic device according to various embodiments.

FIG. 2 is a block diagram illustrating an electronic device 201 according to various embodiments. The electronic device 201 may include, for example, all or part of the electronic device 101 illustrated in FIG. 2. The electronic device 201 may include one or more processors (for example, APs) 210, a communication module 220, a Subscriber Identification Module (SIM) 224, a memory 230, a sensor module 240, an input device 250, a display 260, an interface 270, an audio module 280, a camera module 291, a power management module 295, a battery 296, an indicator 297, and a motor 298. The processors 210 may run, for example, an operating system or an application to control a plurality of hardware or software components that are connected to the processors 210, and may perform various kinds of data processing and operations. The processors 210 may be configured, for example, as a System on Chip (SoC).

According to one embodiment, the processors 210 may further include a Graphic Processing Unit (GPU) and/or an image signal processor. The processors 210 may include at least some (for example, a cellular module 221) of the components illustrated in FIG. 2. The processors 210 may load a command or data received from at least one of other components (for example, a nonvolatile memory) into a volatile memory to process the command or data, and may store resultant data in the nonvolatile memory.

According to one embodiment, when an event for controlling transmission power occurs, the processors 210 may store a transmission power value in the memory 230 every first time, and may calculate the average transmission power value of stored transmission power values. The processor 210 may identify an average SAR value corresponding to the calculated average transmission power value and may determine whether the identified average SAR value exceeds an SAR threshold. The memory 230 may store a lookup table including the average transmission power value of transmission power values stored during a second time according to the event for controlling transmission power and the average SRA value corresponding to the average transmission power value. The processor 210 may identify the average SAR value corresponding to the calculated average transmission power value from the lookup table stored in the memory 230.

When the identified average SAR value exceeds the SAR threshold, the processor 210 may control the communication module 220 to transmit a signal at a first transmission power. When the identified average SAR value does not exceed (or is less than or equal to) the SAR threshold, the processor 210 may control the communication module 220 to transmit a signal at a second transmission power.

The communication module 220 may have a configuration that is the same as, or similar to, that of the communication interface 170. The communication module 220 may include, for example, a cellular module 221, a Wi-Fi module 223, a Bluetooth module 225, a GNSS module 227, an NFC module 228, and an RF module 229. The cellular module 221 may provide, for example, a voice call, a video call, a text messaging service, or an Internet service through a communication network. According to one embodiment, the cellular module 221 may perform identification and authentication of the electronic device 201 in a communication network using a Subscriber Identity Module (SIM, for example, a SIM card) 224. According to one embodiment, the cellular module 221 may perform at least some of the functions provided by the processors 210. According to one embodiment, the cellular module 221 may include a CP. According to one embodiment, at least some (for example, two or more) of the cellular module 221, the Wi-Fi module 223, the Bluetooth module 225, the GNSS module 227, or the NFC module 228 may be included in one Integrated Chip (IC) or IC package. The RF module 229 may transmit and receive, for example, a communication signal (for example, an RF signal). The RF module 229 may include, for example, a transceiver, a Power Amplifier (amp) Module (PAM), a frequency filter, a Low-Noise Amplifier (LNA), at least one antenna, or the like. According to another embodiment, at least one of the cellular module 221, the Wi-Fi module 223, the Bluetooth module 225, the GNSS module 227, or the NFC module 228 may transmit and receive an RF signal through a separate RF module. The SIM 224 may include, for example, a card including a SIM or an embedded SIM, and may include unique identification information (for example, an Integrated Circuit Card Identifier (ICCID)) or subscriber information (for example, an International Mobile Subscriber Identity (IMSI)).

The memory 230 (for example, the memory 130) may include, for example, an internal memory 232 or an external memory 234. The internal memory 232 may include, for example, at least one of a volatile memory (for example, a Dynamic Random-Access Memory (DRAM), a Static RAM (SRAM), a Synchronous Dynamic RAM (SDRAM), or the like) and a nonvolatile memory (for example, a One-Time Programmable Read-Only Memory (OTPROM), a Programmable ROM (PROM), an Erasable and Programmable ROM (EPROM), an Electrically Erasable and Programmable ROM (EEPROM), a mask ROM, a flash ROM, a flash memory, a hard drive, or a Solid-State Drive (SSD)). The external memory 234 may include a flash drive, for example, a Compact Flash (CF), a Secure Digital (SD), a micro Secure Digital (micro-SD), a mini Secure Digital (mini-SD), an extreme digital (xD), a Multi-Media Card (MMC), a memory stick, or the like. The external memory 234 may be functionally or physically connected to the electronic device 201 through various interfaces.

The sensor module 240 may measure, for example, physical quantities, or may detect the state of operation of the electronic device 201 and convert measured or detected information into an electrical signal. The sensor module 240 may include, for example, at least one of a gesture sensor 240A, a gyro sensor 240B, a barometric pressure sensor 240C, a magnetic sensor 240D, an accelerometer 240E, a grip sensor 240F, a proximity sensor 240G, a color sensor 240H (for example, a red, green, and blue (RGB) sensor), a biometric sensor 240I, a temperature/humidity sensor 240J, an illumination sensor 240K, and an ultraviolet (UV) sensor 240M. Additionally or alternatively, the sensor module 240 may include, for example, an E-nose sensor, an electromyography (EMG) sensor, an electroencephalogram (EEG) sensor, an electrocardiogram (ECG) sensor, an infrared (IR) sensor, an iris sensor, and/or a fingerprint sensor. The sensor module 240 may further include a control circuit to control at least one or more sensors belonging thereto. In one embodiment, the electronic device 201 may further include a processor configured, as a part of the processors 210 or separately from the processors 210, to control the sensor module 240, thereby controlling the sensor module 240 while the processors 210 are in a sleep state.

The input device 250 may include, for example, a touch panel 252, a (digital) pen sensor 254, a key 256, or an ultrasonic input device 258. The touch panel 252 may be, for example, at least one of an electrostatic type, a pressure-sensitive type, an infrared type, and an ultrasonic type. Further, the touch panel 252 may further include a control circuit. The touch panel 252 may further include a tactile layer to provide a user with a tactile response. The (digital) pen sensor 254 may, for example, be part of the touch panel or may include a separate recognition sheet. The key 256 may include, for example, a physical button, an optical key, or a keypad. The ultrasonic input device 258 may detect ultrasonic waves generated in an input tool through a microphone (for example, a microphone 288) and may identify data corresponding to the detected ultrasonic waves.

The display 260 (for example, the display 160) may include a panel 262, a hologram device 264, a projector 266, and/or a control circuit to control these components. The panel 262 may be configured, for example, to be flexible, transparent, or wearable. The panel 262 may be formed with the touch panel 252 in one or more modules. According to one embodiment, the panel 262 may include a pressure sensor (or force sensor) to measure the strength of pressure of a user's touch. The pressure sensor may be formed with the touch panel 252 in a single body, or may be provided as one or more sensors separate from the touch panel 252. The hologram device 264 may display a three-dimensional image in the air using light interference. The projector 266 may project light onto a screen to display an image. The screen may be disposed, for example, inside or outside the electronic device 201. The interface 270 may include, for example, an HDMI 272, a USB 274, an optical interface 276, or a D-subminiature (D-sub) interface 278. The interface 270 may be included, for example, in the communication interface 170 illustrated in FIG. 1. Additionally or alternatively, the interface 270 may include, for example, a Mobile High-Definition Link (MHL) interface, an SD card/MMC interface, or an Infrared Data Association (IrDA) interface.

The audio module 280 may bidirectionally convert, for example, sound and an electrical signal. At least some components of the audio module 280 may be included, for example, in the input/output interface 145 illustrated in FIG. 1. The audio module 280 may process sound information input or output, for example, through a speaker 282, a receiver 284, earphones 286, or the microphone 288.

The camera module 291 is a device that takes, for example, a still image and a video. According to one embodiment, the camera module 291 may include one or more image sensors (for example, a front sensor or a rear sensor), a lens, an Image Signal Processor (ISP), or a flash (for example, an LED, a xenon lamp, or the like).

The power management module 295 may manage, for example, the power of the electronic device 201. According to one embodiment, the power management module 295 may include a Power Management Integrated Circuit (PMIC), a charger IC, or a battery or fuel gauge. The PMIC may have wired and/or wireless charging methods. The wireless charging methods may include, for example, a magnetic-resonance method, a magnetic-induction method, or an electromagnetic-wave method, and may further include an additional circuit for wireless charging, such as a coil loop, a resonance circuit, or a rectifier. The battery gauge may measure, for example, the remaining battery charge, the charging voltage, the current, or temperature of the battery 296. The battery 296 may include, for example, a rechargeable battery and/or a solar battery.

The indicator 297 may display the specific state of the electronic device 201 or a component thereof (for example, the processors 210), which may be, for example, a booting state, a message state, or a charging state. The motor 298 may convert an electrical signal into mechanical vibrations, and may generate vibrations or a haptic effect. The electronic device 201 may include a mobile-TV-supporting device (for example, a GPU) that is capable of processing media data in accordance with, for example, Digital Multimedia Broadcasting (DMB), Digital Video Broadcasting (DVB), or MediaFlo™ standards. Each element mentioned in this document may include one or more components, and may be designated by different terms depending on the type of the electronic device. In various embodiments, an electronic device (for example, the electronic device 201) may be configured such that some elements are omitted, additional elements are further included, or some of the elements are combined into one entity, which may perform the same functions as those of the corresponding elements before combination.

Figure 3:
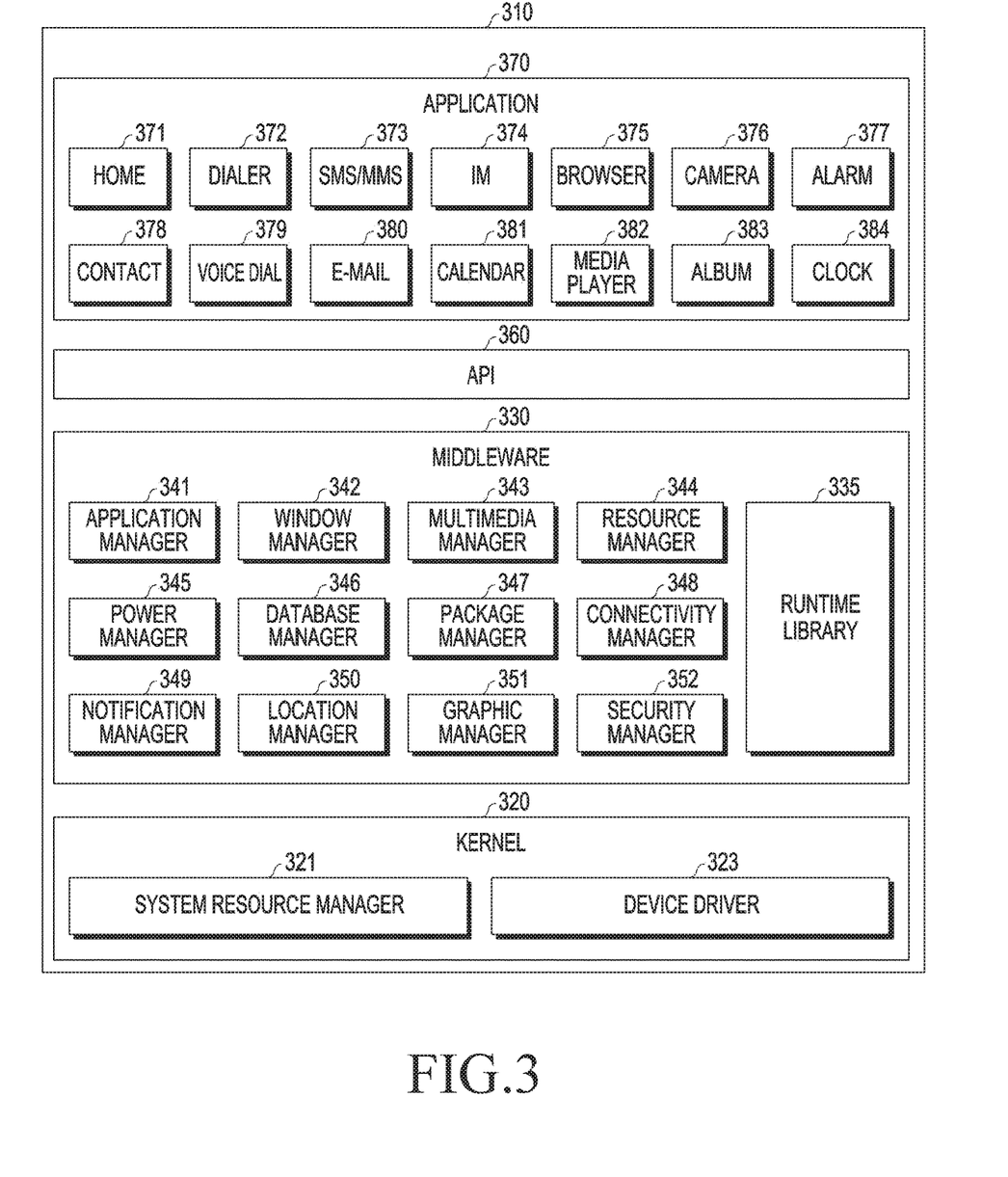
FIG. 3 is a block diagram illustrating a program module according to various embodiments.

FIG. 3 is a block diagram illustrating a program module according to various embodiments. According to one embodiment, the program module 310 (for example, the program 140) may include an operating system that controls resources related to an electronic device (for example, the electronic device 101) and/or various applications (for example, the application 147) that run on the operating system. The operating system may include, for example, Android™, iOS™, Windows™, Symbian™, Tizen™, Bada™, or the like. Referring to FIG. 3, the program module 310 may include a kernel 320 (for example, the kernel 141), middleware 330 (for example, the middleware 143), an API 360 (for example, the API 145), and/or an application 370 (for example, the application 147). At least part of the program module 310 may be preloaded onto the electronic device or may be downloaded from an external electronic device (for example, the electronic device 102 or 104, the server 106, or the like).

The kernel 320 may include, for example, a system resource manager 321 and/or a device driver 323. The system resource manager 321 may perform control, allocation, or recovery of system resources. According to one embodiment, the system resource manager 321 may include a process manager, a memory manager, or a file-system manager. The device driver 323 may include, for example, a display driver, a camera driver, a Bluetooth driver, a shared memory driver, a USB driver, a keypad driver, a Wi-Fi driver, an audio driver, or an Inter-Process Communication (IPC) driver. The middleware 330 may provide, for example, functions commonly needed for applications 370, or may provide an application 370 with various functions through the API 360 so that the application 370 may use the limited system resources in the electronic device. According to one embodiment, the middleware 330 may include at least one of a runtime library 335, an application manager 341, a window manager 342, a multimedia manager 343, a resource manager 344, a power manager 345, a database manager 346, a package manager 347, a connectivity manager 348, a notification manager 349, a location manager 350, a graphic manager 351, and a security manager 352.

The runtime library 335 may include, for example, a library module used by a complier to add a new function through a programming language while the application 370 is running. The runtime library 335 may perform input/output management, memory management, or arithmetic function processing. The application manager 341 may manage, for example, the life cycle of the application 370. The window manager 342 may manage Graphic User Interface (GUI) resources used for a screen. The multimedia manager 343 may identify formats that are necessary to play media files, and may encrypt or decrypt a media file using a codec suitable for a corresponding format. The resource manager 344 may manage source code or memory space for the application 370. The power manager 345 may manage, for example, the capacity or power supply of a battery and may provide information on power necessary for the operation of the electronic device. According to one embodiment, the power manager 345 may interwork with a Basic Input/ Output System (BIOS). The database manager 346 may generate, retrieve, or change a database to be used for, for example, the application 370. The package manager 347 may manage the installation or updating of an application distributed in the form of a package file.

The connectivity manager 348 may manage, for example, wireless connectivity. The notification manager 349 may provide a user with an event, for example, an incoming message, an appointment, and a proximity notification. The location manager 350 may manage, for example, information about the location of the electronic device. The graphic manager 351 may manage, for example, a graphic effect to be provided for the user or a user interface related to the graphic effect. The security manager 352 may provide, for example, system security or user authentication. According to one embodiment, the middleware 330 may include a telephony manager to manage a voice or video call function of the electronic device or a middleware module that is capable of forming combinations of functions of the foregoing elements. According to one embodiment, the middleware 330 may provide a specialized module for each operating system. The middleware 330 may dynamically delete some of the existing elements or add new elements. The API 360 is, for example, a set of API programming functions, and may be provided with a different configuration depending on the operating system. For example, one API set for each platform may be provided in Android or iOS, while two or more API sets for each platform may be provided in Tizen.

The application 370 may include, for example, a home screen 371, a dialer 372, an SMS/MMS 373, Instant Messaging (IM) 374, a browser 375, a camera 376, an alarm 377, an address book 378, a voice dialer 379, email 380, a calendar 381, a media player 382, an album 383, a clock 384, a healthcare application (for example, for measuring exercising or blood sugar), or an environmental data application (for example, for providing atmospheric pressure, humidity, or temperature data). According to one embodiment, the application 370 may include an information exchange application that is capable of supporting information exchange between the electronic device and an external electronic device. The information exchange application may include, for example, a notification relay application for relaying specific information to the external electronic device or a device management application for managing the external electronic device. For example, the notification relay application may relay notification information, which is generated in another application of the electronic device, to the external electronic device, or may receive notification information from the external electronic device and provide the notification information to the user. The device management application may install, delete, or update, for example, a function (for example, a function of turning on/turning off the external electronic device itself (or some components thereof) or adjusting the brightness (or resolution) of a display) of an external electronic device communicating with the electronic device or an application operating in the external electronic device. According to one embodiment, the application 370 may include an application (for example, a healthcare application of a mobile medical device) assigned according to the attributes of the external electronic device. According to one embodiment, the application 370 may include an application received from the external electronic device. At least part of the program module 310 may be implemented (for example, run) by software, firmware, hardware (for example, the processors 210), or combinations of at least two or more thereof, and may include a module, a program, a routine, sets of instructions, or a process to perform one or more functions.

Figure 4:
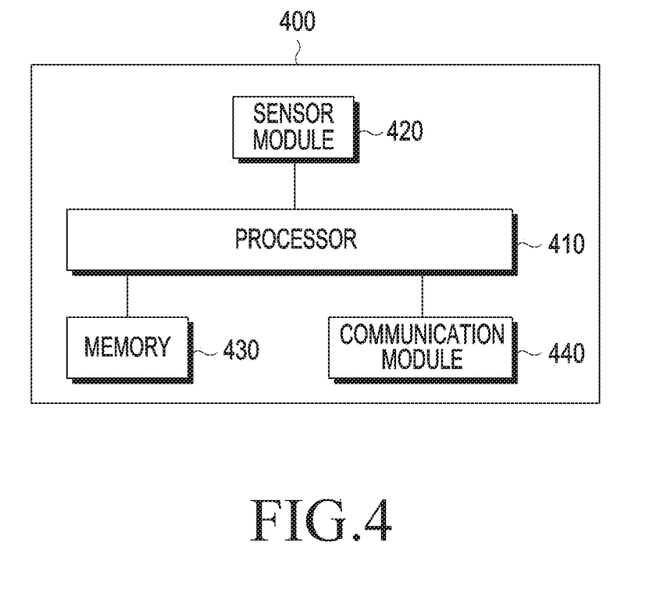
FIG. 4 illustrates the configuration of an electronic device according to various embodiments.

FIG. 4 illustrates the configuration of an electronic device according to various embodiments.

Referring to FIG. 4, the electronic device 400 may include a processor 410, a sensor module 420, a memory 430, and a communication module 440.

According to one embodiment, when an event for controlling transmission power occurs, the processor 410 may store a transmission power value of the communication module 440 in the memory 430 during a first time. For example, the event for controlling transmission power may include a case where the sensor module (for example, a proximity sensor or grip sensor) 420 detects the proximity of an object (for example, a user, a body, a face, a hand, or the like) or a grip by the object or a case where a country or communication code of the electronic device 400 is changed. The first time may be a variable time, for example, 6 minutes, 12 minutes, 24 minutes, or the like.

According to various embodiments, the processor 410 may determine whether the object is located within a certain distance through the sensor module (for example, the proximity sensor) 420. When the object is located within the certain distance, the processor 410 may store the transmission power value of the communication module 440 in the memory 430 every second time during the first time. For example, the second time may be a variable time and may be the same time as the first time. The second time may be a time counted after the event for controlling transmission power occurs. For example, the second time may include 5 ms, 10 ms, 20 ms, or the like. According to various embodiments, the second time may vary depending on the country or communication code.

According to various embodiments, the processor 410 may determine whether the touch of a particular position (or area) of the electronic device 400 is detected through the sensor module (for example, the grip sensor) 420. When the touch of the particular position (or area) of the electronic device 400 is detected, the processor 410 may store the transmission power value of the communication module 440 in the memory 430 every first time.

According to one embodiment, the processor 410 may calculate the average transmission power value of transmission power values stored in the memory 430 during the first time and may determine an average SAR value corresponding to the calculated average transmission power value. The processor 410 may identify the average SAR value corresponding to the calculated average transmission power value from a lookup table including the average SAR value according to the average transmission power value, which is stored in the memory 430.

According to one embodiment, the processor 410 may determine whether the identified average SAR value exceeds an SAR threshold (for example, an average SAR limit) When the identified average SAR value exceeds the SAR threshold, the processor 410 may control the communication module 440 to transmit a signal at a first transmission power. For example, the SAR threshold may be set to a specific value within a range that does not exceed an SAR value determined according to rules. The first transmission power includes a transmission power value set not to exceed the SAR threshold and may be set to one of transmission power values that are less than or equal to a value (for example, a backoff power limit) obtained by backing off a specific transmission power value from a maximum transmission power value.

According to one embodiment, when the identified average SAR value does not exceed (or is less than or equal to) the SAR threshold, the processor 410 may control the communication module 440 to transmit a signal at a second transmission power. For example, the second transmission power may be set to one of transmission power values that are less than or equal to the maximum transmission power value (for example, a maximum power limit) that can be output by the communication module 440.

According to one embodiment, the sensor module 420 may include at least one of a proximity sensor to determine whether an object is within a certain distance and a grip sensor to determine whether the touch of at least one position (or area) of the electronic device 400 is detected.

The memory 430 may store information (or data) necessary for controlling transmission power. According to one embodiment, the memory 430 may store a lookup table including the average transmission power value of transmission power values stored during the second time according to an event for controlling transmission power and an average SAR value corresponding to the average transmission power value.

The communication module 440 may perform communication with an external electronic device. According to one embodiment, the communication module 440 may transmit and receive signals to and from the external electronic device and may control transmission power for signal transmission under the control of the processor 410. For example, the communication module 440 may transmit a signal at the first transmission power or the second transmission power under the control of the processor 410.

According to various embodiments, the electronic device 400 may further include the sensor module 420 to detect the proximity of the electronic device 400 or a grip on the electronic device 400.

According to various embodiments, the processor 410 may store transmission power values every second time during the first time after the proximity or the grip is detected.

According to various embodiments, the second time may be counted after the proximity or the grip is detected.

According to various embodiments, the processor 410 may calculate an average transmission power value by dividing the sum of the transmission power values stored every second time during the first time by the number of the stored transmission power values.

According to various embodiments, when the proximity of the electronic device 400 or the grip on the electronic device 400 is not detected, the processor 410 may control the communication module 440 to transmit the signal at the second transmission power different from the first transmission power.

According to various embodiments, the first transmission power may include one of transmission power values that are less than or equal to a transmission power value that is lower than the second transmission power, and the second transmission power may include one of transmission power values that are less than or equal to the maximum transmission power value that can be output by the communication module 440.

According to various embodiments, when the proximity of the electronic device 400 or the grip on the electronic device 400 is not detected, the processor 410 may control the communication module 440 to transmit the signal at the second transmission power different from the first transmission power.

According to various embodiments, the first transmission power may include one of transmission power values that are less than or equal to a transmission power value that is lower than the second transmission power, and the second transmission power may include one of transmission power values that are less than or equal to the maximum transmission power value that can be output by the communication module 440.

According to various embodiments, the memory 430 may store a lookup table including an average transmission power value and an average SAR value according to at least one state of the electronic device 400.

According to various embodiments, the processor 410 may identify an average SAR value corresponding to the average transmission power value from the lookup table.

According to various embodiments, the memory 430 may store up to 72000 transmission power values.

Figure 5:
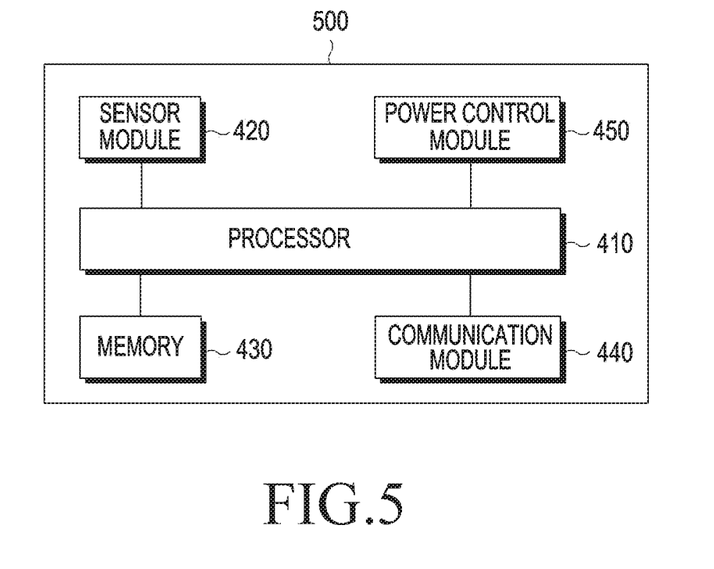
FIG. 5 illustrates the configuration of an electronic device according to various embodiments.

FIG. 5 illustrates the configuration of an electronic device according to various embodiments.

Referring to FIG. 5, the electronic device 400 may include a processor 410, a sensor module 420, a memory 430, a communication module 440, and a power control module 450.

According to one embodiment, when an event for controlling transmission power occurs, the processor 410 may activate the power control module 450.

According to one embodiment, the power control module 450 may store a transmission power value of the communication module 440 in the memory 430 during a first time. For example, the power control module 450 may store transmission power values in the memory 430 by a queue method. For example, the memory 430 may store up to 72000 transmission power values by a queue method including up to 72000 entries. The queue method may include a circular queue method or a linked queue method. According to various embodiments, the power control module 450 may continuously store transmission power values in the memory 430 using the queue method.

According to one embodiment, the power control module 450 may calculate the average transmission power value of transmission power values stored in the memory 430 during the first time and may identify an average SAR value corresponding to the calculated average transmission power value. For example, when the memory 430 includes entries for storing up to 72000 pieces of data, the power control module 450 may store the transmission power value in the memory 430 every 5 ms for six minutes. The power control module 450 may store transmission power values every 5 ms for six minutes after the occurrence of the event and may calculate an average transmission power value by dividing the sum of the stored transmission power values by the number of the stored transmission power values. The power control module 450 may identify an average SAR value corresponding to the calculated average transmission power value from a lookup table stored in the memory 430.

According to one embodiment, the power control module 450 may determine whether the identified average SAR value exceeds an SAR threshold. When the identified average SAR value exceeds the SAR threshold, the power control module 450 may control the communication module 440 to transmit a signal at a first transmission power. Alternatively, the power control module 450 may transmit a request signal to the processor 410 so that the processor 410 controls the communication module 440.

When the identified average SAR value does not exceed the SAR threshold, the power control module 450 may control the communication module 440 to output second transmission power. For example, the first transmission power may have a lower power value than the second transmission power.

According to one embodiment, when the event for controlling transmission power is terminated, the processor 410 may deactivate the power control module 450. For example, when the electronic device 400 is located in a weak-electric-field network, if the proximity of an object or a grip by the object is not detected, the processor 410 may deactivate the power control module 450 and may control the communication module 440 to transmit a signal at one of transmission powers less than or equal to a maximum transmission power.

According to one embodiment, the sensor module 420 may include at least one of a proximity sensor and a grip sensor. The sensor module 420 may determine the proximity of an object or may determine whether a pressure is detected at a particular position of the electronic device 400.

The memory 430 may store data (for example, a lookup table) relating to transmission power control as described in FIG. 4.

The communication module 440 may transmit a communication signal at the first transmission power or the second transmission power under the control of the power control module 450 or the processor 410.

According to various embodiments, the power control module 450 may perform the foregoing operation for controlling transmission power under the control of the processor 410.

Figure 6:
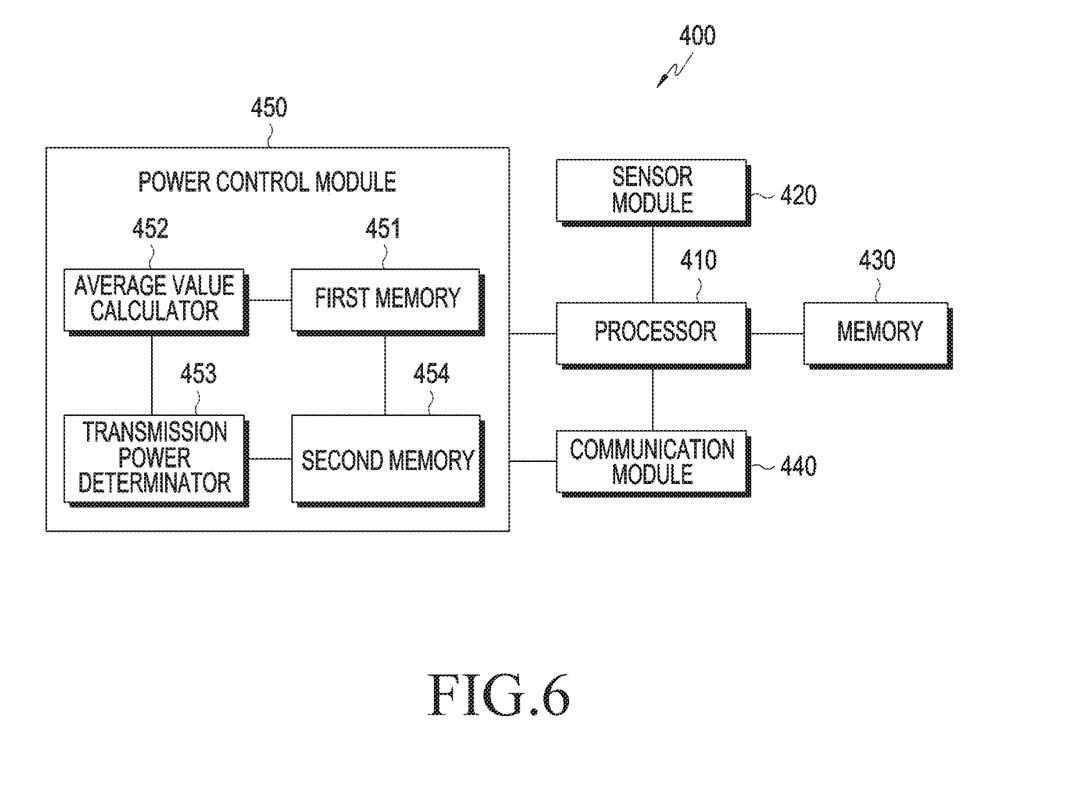
FIG. 6 illustrates the configuration of a power control module according to various embodiments.

FIG. 6 illustrates the configuration of a power control module according to various embodiments.

Referring to FIG. 6, the power control module 450 may include a first memory 451, an average value calculator 452, a transmission power determinator 453, or a second memory 454.

According to one embodiment, when the proximity of an object or a grip by the object is detected and thus the power control module 450 is activated by the processor 410, the average value calculator 452 may store a transmission power value in the first memory 451 every first time after the activation. For example, when the first memory 451 stores up to 72000 pieces of data, the average value calculator 452 may store the transmission power value in the first memory 451 every 5 ms. For example, the first memory 451 may store 72,000 transmission power values every 5 ms for 6 minutes. Alternatively, the first memory 451 may store 72,000 transmission power values every 10 ms for 12 minutes, or every 20 ms for 24 minutes. According to various embodiments, the number of transmission power values stored in the first memory 451 may be variable.

According to one embodiment, the average value calculator 452 may calculate the average value (for example, the average transmission power value) of transmission power values stored in the first memory 451. For example, the average value calculator 454 may not calculate the average value of transmission power values stored for first 5 ms after the power control module 450 is activated.

According to one embodiment, the transmission power determinator 453 may identify an average SAR value corresponding to the average transmission power value, calculated by the average value calculator 452, from a lookup table stored in the second memory 454. For example, the second memory 454 may store the lookup table including an average transmission power value according to the proximity of an object or a grip by the object and an average SAR value corresponding to the average transmission power value.

According to one embodiment, the transmission power determinator 453 may compare the identified average SAR value with an SAR threshold and may determine whether the identified average SAR value exceeds the SAR threshold.

According to one embodiment, when the average SAR value exceeds the SAR threshold, the transmission power determinator 453 may transmit a request signal (or control signal) to the communication module 440 so that the communication module 440 transmits a signal at a first transmission power. For example, the first transmission power may be one of transmission power values that are less than or equal to a value (for example, a backoff transmission power value) obtained by backing off a specific transmission power value from a maximum transmission power value that can be output by the communication module 440.

According to one embodiment, when the average SAR value does not exceed the SAR threshold, the transmission power determinator 453 may transmit a request signal (or control signal) to the communication module 440 so that the communication module 440 transmits a signal at a second transmission power. For example, the second transmission power may be one of transmission power values that are less than or equal to the maximum transmission power value that can be output by the communication module 440.

According to one embodiment, when the proximity of an object or a grip by the object is not detected, the processor 410 may deactivate the power control module 450 and may control the communication module 440 to transmit a signal at the second transmission power.

An electronic device 400 according to various embodiments may include: a communication module 440; a memory 430; a power control module 450; and a processor 410 electrically connected to the communication module 440, the memory 430, and the communication control module 450, wherein the processor 410 may activate the power control module 450 when a proximity to the electronic device 400 or a grip on the electronic device 400 is detected, and the activated power control module 450 may: store a transmission power value during a first time; calculate the average transmission power value of transmission power values stored during the first time; control the communication module 440 to transmit a signal at a first transmission power when an average SAR value corresponding to the calculated average transmission power value exceeds an SAR threshold; and control the communication module 440 to transmit the signal at a second transmission power, which is different from the first transmission power, when the average SAR value does not exceed the SAR threshold.

Figure 7:
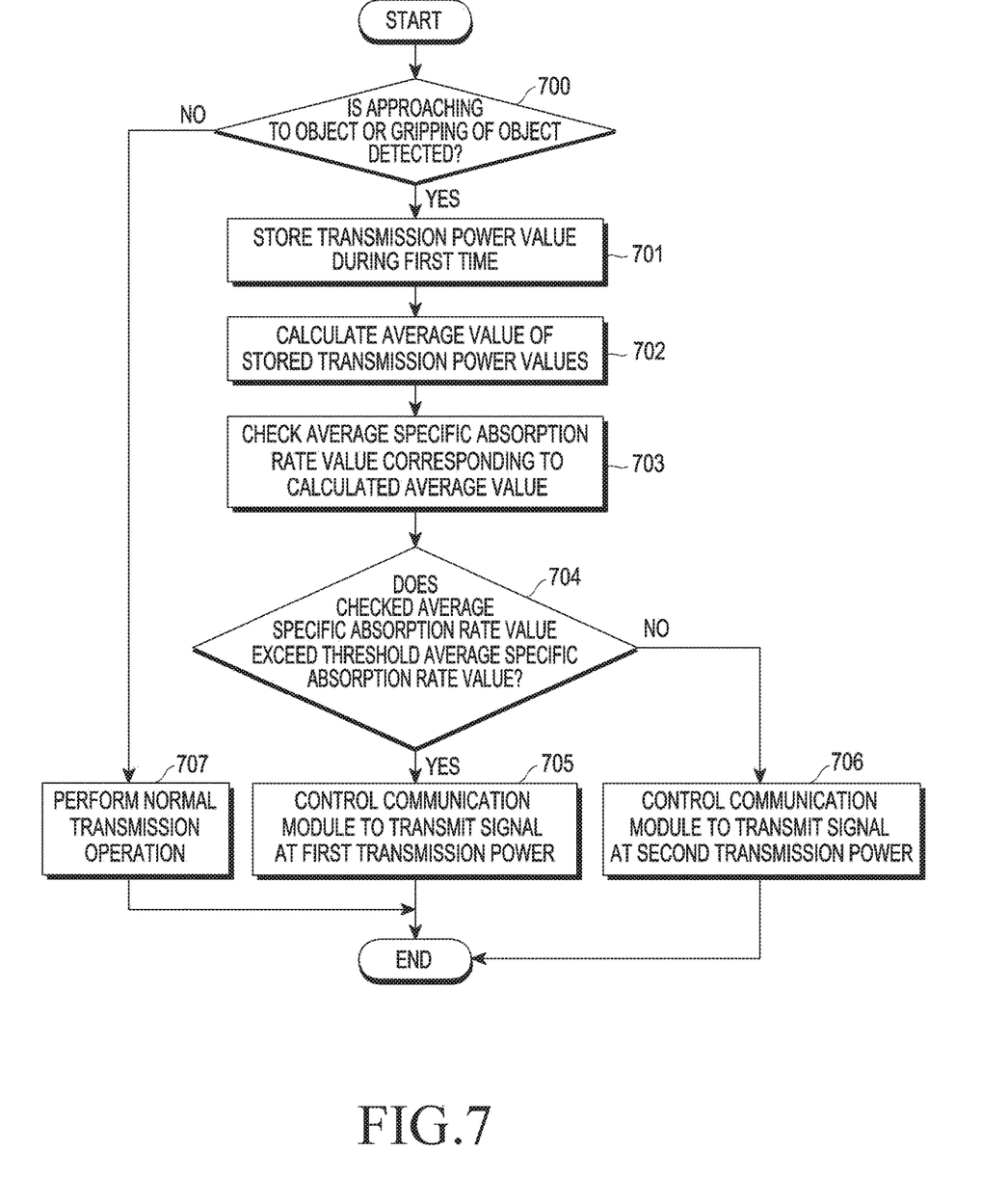
FIG. 7 is a flowchart illustrating an electronic device controlling transmission power according to various embodiments.

FIG. 7 is a flowchart illustrating that an electronic device controls transmission power according to various embodiments.

According to various embodiments, operations 700 to 706 may be performed by any one of the electronic device 101, 102, 104, 201, or 400, the server 106, the processor 120, 210, or 410, the program module 310, and the power control module 450.

Referring to FIG. 7, in operation 700, the electronic device 400 (for example, the processor 410) may determine whether the proximity of an object or a grip by the object is detected. When the proximity of the object or the grip by the object is detected, the electronic device 400 (for example, the processor 410) may perform operation 701. When the proximity of the object or the grip by the object is not detected, the electronic device 400 (for example, the processor 410) may perform a normal transmission operation in operation 707.

In operation 701, the electronic device 400 (for example, the processor 410) may store a transmission power value in the memory 430 during a first time. For example, the proximity of the object or the grip by the object is detected by the sensor module 420, the electronic device 400 (for example, the processor 410) may store a transmission power value in the memory 430 every second time during the first time.

In operation 702, the electronic device 400 (for example, the processor 410) may calculate the average value of transmission power values stored in the memory 430.

In operation 703, the electronic device 400 (for example, the processor 410) may identify an average SAR corresponding to the calculated average value. According to one embodiment, the electronic device 400 (for example, the processor 410) may identify an average SAR value corresponding to the calculated average transmission power value from a lookup table stored in the memory 430.

In operation 704, the electronic device 400 (for example, the processor 410) may determine whether the identified average SAR value exceeds an average SAR threshold. When the identified average SAR value exceeds the average SAR threshold, the electronic device 400 (for example, the processor 410) may perform operation 705. When the identified average SAR value does not exceed the average SAR threshold, the electronic device 400 (for example, the processor 410) may perform operation 706. For example, when the average SAR value is less than or equal to the average SAR threshold, the electronic device 400 (for example, the processor 410) may perform operation 706.

In operation 705, the electronic device 400 (for example, processor 410) may control the communication module 440 to transmit a signal at a first transmission power. For example, the electronic device 400 (for example, the processor 410) may control the communication module 440 to transmit a signal at one transmission power of transmission power values that are less than or equal to a backoff transmission power value.

In operation 706, the electronic device 400 (for example, processor 410) may control the communication module 440 to transmit a signal at a second transmission power. For example, the electronic device 400 (for example, the processor 410) may control the communication module 440 to transmit a signal at one transmission power of transmission power values that are less than or equal to a maximum transmission power value.

Figure 8:
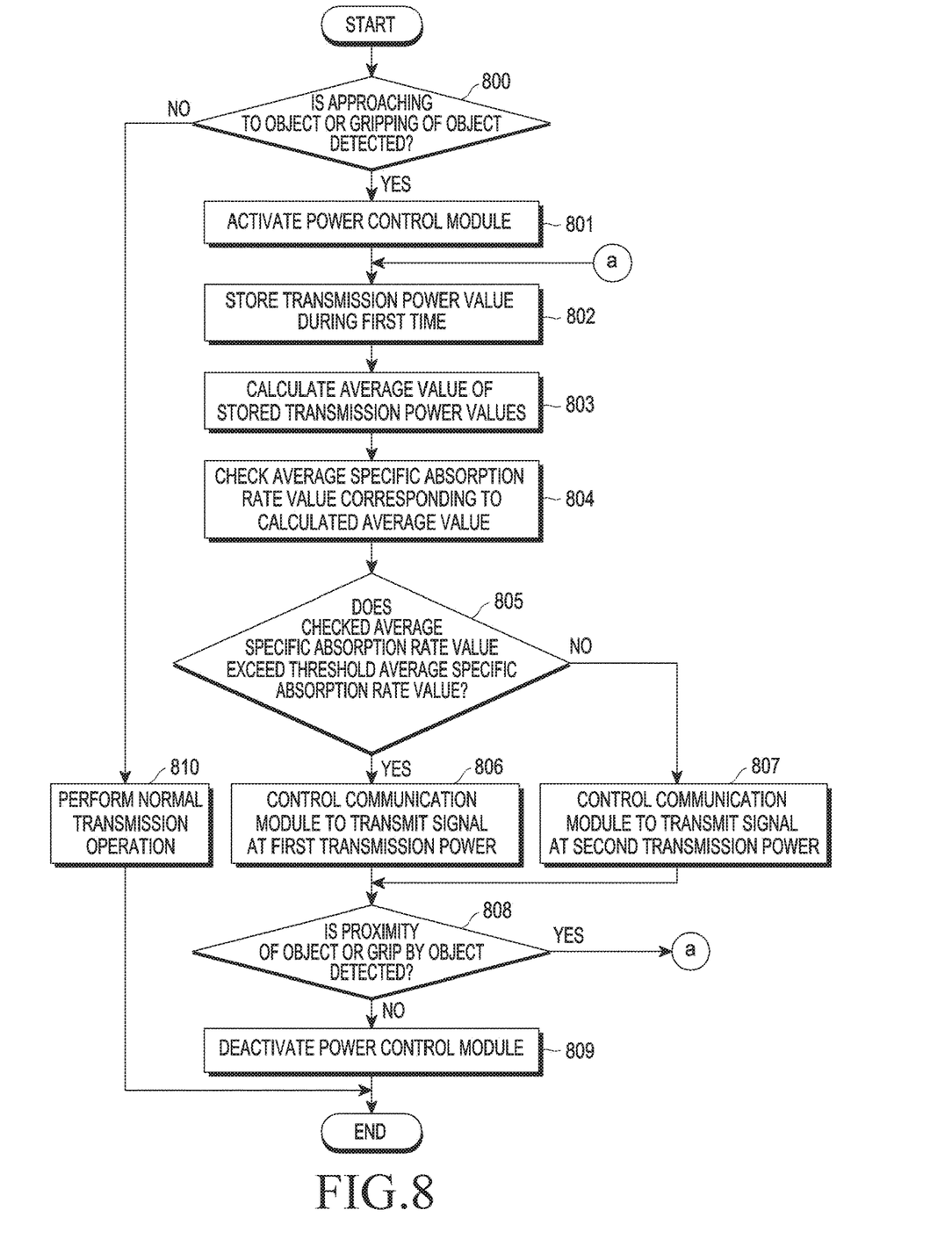
FIG. 8 is a flowchart illustrating an electronic device controlling transmission power according to various embodiments.

FIG. 8 is a flowchart illustrating that an electronic device controls transmission power according to various embodiments.

According to various embodiments, operations 800 to 809 may be performed by any one of the electronic device 101, 102, 104, 201, or 400, the server 106, the processor 120, 210, or 410, the program module 310, and the power control module 450.

Referring to FIG. 8, in operation 800, the electronic device 400 (for example, the processor 410) may determine whether the proximity of an object or a grip by the object is detected. When the proximity of the object or the grip by the object is detected, the electronic device 400 (for example, the processor 410) may perform operation 801. When the proximity of the object or the grip by the object is not detected, the electronic device 400 (for example, the processor 410) may perform a normal transmission operation in operation 810.

In operation 801, the electronic device 400 (for example, the processor 410) may activate the power control module 450.

In operation 802, the electronic device 400 (for example, the processor 410) may store a transmission power value in the memory 430 during a first time using the power control module 450. For example, the proximity of the object or the grip by the object is detected by the sensor module 420, the electronic device 400 (for example, the processor 410) may store a transmission power value in the memory 430 every second time during the first time.

In operation 803, the electronic device 400 (for example, the processor 410) may calculate the average value (for example, the average transmission power value) of transmission power values stored in the memory 430 using the power control module 450.

In operation 804, the electronic device 400 (for example, the processor 410) may determine an average SAR value corresponding to the calculated average value. For example, the power control module 450 may identify an average SAR value corresponding to the average transmission power value from a lookup table stored in the memory 430.

In operation 805, the electronic device 400 (for example, the processor 410) may determine whether the identified average SAR value exceeds an average SAR threshold using the power control module 450. When the identified average SAR value exceeds the average SAR threshold, the electronic device 400 (for example, the processor 410) may perform operation 806. When the identified average SAR value does not exceed the average SAR threshold, the electronic device 400 (for example, the processor 410) may perform operation 807. For example, when the identified average SAR value is less than or equal to the average SAR threshold, the electronic device 400 (for example, the processor 410) may perform operation 807.

In operation 806, the electronic device 400 (for example, processor 410) may control the communication module 440 to transmit a signal at a first transmission power (for example, a backoff transmission power limit) using the power control module 450. For example, the electronic device 400 (for example, the processor 410) may control the communication module 440 to transmit a signal at one transmission power of transmission power values that are less than or equal to a backoff transmission power value.

In operation 807, the electronic device 400 (for example, processor 410) may control the communication module 440 to transmit a signal at a second transmission power (for example, a maximum transmission power limit) using the power control module 450. For example, the electronic device 400 (for example, the processor 410) may control the communication module 440 to transmit a signal at one transmission power of transmission power values that are less than or equal to a maximum transmission power value.

In operation 808, the electronic device 400 (for example, the processor 410) may determine whether the proximity of an object or a grip by the object is detected. When the proximity of the object or the grip by the object is not detected, the electronic device 400 (for example, the processor 410) may deactivate the power control module 450 in operation 809. When the proximity of the object or the grip by the object is detected, the electronic device 400 (for example, the processor 410) may store a transmission power value during the first time using the power control module 450 and may perform operations 803 to 809.

A method of an electronic device 400 according to various embodiments may include: determining whether proximity to the electronic device 400 or a grip on the electronic device 400 is detected; storing a transmission power value during a first time when the proximity to the electronic device 400 or the grip on the electronic device 400 is detected; calculating an average transmission power value of transmission power values stored during the first time; and transmitting a signal at a first transmission power when an average SAR value corresponding to the calculated average transmission power value exceeds an SAR threshold; and transmitting the signal at a second transmission power, which is different from the first transmission power, when the average SAR value does not exceed the SAR threshold.

According to various embodiments, the transmitting of the signal at the first transmission power may include storing the transmission power values every second time during the first time after the proximity or the grip is detected.

According to various embodiments, the second time may be counted after the proximity or the grip is detected.

According to various embodiments, the calculating of the average transmission power value may include calculating the average transmission power value by dividing a sum of the transmission power values stored every second time during the first time by a number of the stored transmission power values.

According to various embodiments, the method may further include transmitting the signal at the second transmission power, which is different from the first transmission power, when the proximity to the electronic device 400 or the grip on the electronic device 400 is not detected.

According to various embodiments, the first transmission power may include any one of transmission power values that are less than or equal to a transmission power value that is lower than the second transmission power, and the second transmission power may include any one of transmission power values that are less than or equal to a maximum transmission power value that can be output by a communication module 440.

According to various embodiments, the method may further include storing a lookup table including an average transmission power value and an average SAR value according to at least one state of the electronic device 400 in a memory.

According to various embodiments, the method may further include identifying the average SAR value corresponding to the average transmission power value from the lookup table.

According to various embodiments, up to 72000 transmission power values may be stored in the memory.

According to various embodiments, an electronic device may control transmission power using an average SAR value according to an average transmission power value depending on the proximity of an object or a grip by the object, thereby improving the transmission performance of a communication module while satisfying a regulated SAR.

The term "module" as used herein may include a unit consisting of hardware, software, or firmware, and may, for example, be used interchangeably with the term "logic", "logical block", "component", "circuit", or the like. The "module" may be an integrated component, or a minimum unit for performing one or more functions or a part thereof. The "module" may be mechanically or electronically implemented and may include, for example, an Application-Specific Integrated Circuit (ASIC) chip, a Field-Programmable Gate Arrays (FPGA), or a programmable-logic device, which has been known or are to be developed in the future, for performing certain operations. At least some of devices (e.g., modules or functions thereof) or methods (e.g., operations) according to various embodiments may be implemented by an instruction which is stored a computer-readable storage medium (e.g., the memory 130) in the form of a program module. The instruction, when executed by a processor (e.g., the processor 120), may cause the one or more processors to execute the function corresponding to the instruction. The computer-readable storage medium may include a hard disk, a floppy disk, a magnetic medium (e.g., a magnetic tape), an Optical Media (e.g., CD-ROM, DVD), a Magneto-Optical Media (e.g., a floptical disk), an inner memory, etc. The instruction may include a code made by a complier or a code that can be executed by an interpreter. The programming module according to the disclosure may include one or more of the aforementioned elements or may further include other additional elements, or some of the aforementioned elements may be omitted. Operations performed by a module, a programming module, or other elements according to various embodiments may be executed sequentially, in parallel, repeatedly, or in a heuristic manner. At least some operations may be executed according to another sequence, may be omitted, or may further include other operations.

The invention claimed is:

1. An electronic device comprising:
   a communication interface;
   a memory; and
   a processor configured to be electrically connected to the communication interface and the memory,
   wherein the processor is configured to:
      calculate an average transmission power value of transmission power values acquired through the communication interface during a first time after a grip on the electronic device is detected,
      identify an average Specific Absorption Rate (SAR) value corresponding to the calculated average transmission power value using a lookup table, wherein the lookup table defines a relationship between a plurality of average SAR values and a plurality of average transmission power values,
      control the communication interface to transmit a signal at a first transmission power when the average SAR value exceeds an SAR threshold, and
      control the communication interface to transmit the signal at a second transmission power, which is different from the first transmission power, when the average SAR value does not exceed the SAR threshold.

2. The electronic device of claim 1, further comprising:
   a sensor configured to detect the grip on the electronic device.

3. The electronic device of claim 1, wherein the processor is further configured to store the transmission power values every second time during the first time after the grip is detected.

4. The electronic device of claim 3, wherein the second time is configured to be counted after the grip is detected.

5. The electronic device of claim 3, wherein the processor is further configured to calculate the average transmission power value by dividing a sum of the transmission power values stored every second time during the first time by a number of the stored transmission power values.

6. The electronic device of claim 1, wherein the processor is further configured to control the communication interface to transmit the signal at the second transmission power, which is different from the first transmission power, when the grip on the electronic device is not detected.

7. The electronic device of claim 1,
   wherein the first transmission power comprises any one of transmission power values that are less than or equal to a transmission power value that is lower than the second transmission power, and wherein the second transmission power comprises any one of transmission power values that are less than or equal to a maximum transmission power value that is output by the communication interface.

8. An electronic device comprising:
a communication interface;
a memory;
a power control interface; and
a processor configured to be electrically connected to the communication interface, the memory, and the power control interface,
wherein the processor is configured to activate the power control module interface when a grip on the electronic device is detected, and
wherein the activated power control interface is configured to:
calculate an average transmission power value of transmission power values acquired through the communication interface during a first time after the grip on the electronic device is detected,
identify an average Specific Absorption Rate (SAR) value corresponding to the calculated average transmission power value using a lookup table, wherein the lookup table defines a relationship between a plurality of average SAR values and a plurality of average transmission power values,
control the communication interface to transmit a signal at a first transmission power when the average SAR value exceeds an SAR threshold, and
control the communication interface to transmit the signal at a second transmission power, which is different from the first transmission power, when the average SAR value does not exceed the SAR threshold.

9. A storage medium that stores commands, the commands being configured to enable at least one processor to perform at least one operation when executed by the at least one processor, the at least one operation comprising:
determining whether a grip on an electronic device is detected;
calculating an average transmission power value of transmission power values during a first time after a grip on the electronic device is detected;
identifying an average Specific Absorption Rate (SAR) value corresponding to the calculated average transmission power value using a lookup table, wherein the lookup table defines a relationship between a plurality of average SAR values and a plurality of average transmission power values;
transmitting a signal at a first transmission power when the average SAR value exceeds an SAR threshold; and
transmitting the signal at a second transmission power, which is different from the first transmission power, when the average SAR value does not exceed the SAR threshold.

10. The storage medium of claim 9, wherein the transmitting of the signal at the first transmission power comprises storing the transmission power values every second time during the first time after the grip is detected.

11. The storage medium of claim 10, wherein the second time is configured to be counted after the grip is detected.

12. The storage medium of claim 10, wherein the calculating of the average transmission power value comprises calculating the average transmission power value by dividing a sum of the transmission power values stored every second time during the first time by a number of the stored transmission power values.

13. The storage medium of claim 9, further comprising:
transmitting the signal at the second transmission power, which is different from the first transmission power, when the grip on the electronic device is not detected.

14. The storage medium of claim 9,
wherein the first transmission power comprises any one of transmission power values that are less than or equal to a transmission power value that is lower than the second transmission power, and
wherein the second transmission power comprises any one of transmission power values that are less than or equal to a maximum transmission power value that is output by a communication interface.

15. The storage medium of claim 9, further comprising:
storing the lookup table in a memory.

* * * * *